United States Patent
Yang et al.

(10) Patent No.: US 8,692,134 B2
(45) Date of Patent: Apr. 8, 2014

(54) BRACE FOR LONG WIRE BOND

(75) Inventors: Jie Yang, Tianjin (CN); Qingchun He, Tianjin (CN); Hanmin Zhang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 331 days.

(21) Appl. No.: 13/210,392

(22) Filed: Aug. 16, 2011

(65) Prior Publication Data

US 2012/0145446 A1 Jun. 14, 2012

(30) Foreign Application Priority Data

Dec. 8, 2010 (CN) .......................... 2010 1 0590311

(51) Int. Cl.
*H05K 1/11* (2006.01)

(52) U.S. Cl.
USPC ........... 174/261; 174/260; 174/538; 174/563; 257/676; 257/686; 257/737; 257/777; 438/109; 438/123

(58) Field of Classification Search
USPC .......... 174/261, 260, 538, 563; 257/676, 686, 257/737, 777; 438/109, 123
See application file for complete search history.

(56) References Cited

U.S. PATENT DOCUMENTS

| 4,903,114 | A  | * | 2/1990  | Aoki et al.  | 257/666 |
|-----------|----|---|---------|--------------|---------|
| 5,200,362 | A  |   | 4/1993  | Lin          |         |
| 5,273,938 | A  |   | 12/1993 | Lin          |         |
| 5,408,127 | A  | * | 4/1995  | Mostafazadeh | 257/676 |
| 6,348,726 | B1 |   | 2/2002  | Bayan        |         |
| 7,347,352 | B2 |   | 3/2008  | Qin          |         |
| 2002/0153166 | A1 | * | 10/2002 | Chang     | 174/260 |
| 2004/0124545 | A1 |   | 7/2004  | Wang      |         |
| 2004/0201088 | A1 | * | 10/2004 | Kim et al.| 257/686 |
| 2007/0105280 | A1 | * | 5/2007  | Li        | 438/123 |
| 2008/0023831 | A1 | * | 1/2008  | Nishimura et al. | 257/737 |
| 2008/0026506 | A1 | * | 1/2008  | Kim et al.| 438/109 |
| 2008/0116548 | A1 |   | 5/2008  | Li        |         |
| 2009/0085220 | A1 | * | 4/2009  | Bernhardt et al. | 257/777 |
| 2009/0189292 | A1 | * | 7/2009  | Reiss et al. | 257/777 |
| 2009/0321927 | A1 | * | 12/2009 | Nishimura et al. | 257/737 |
| 2012/0077316 | A1 | * | 3/2012  | Huang et al. | 438/123 |

* cited by examiner

*Primary Examiner* — Xiaoliang Chen
(74) *Attorney, Agent, or Firm* — Charles Bergere

(57) ABSTRACT

An electrical connection includes a first wire bonded to adjacent bond pads proximate to an edge of a die and a second wire having one end bonded to a die bond pad distal to the die edge and a second end bonded to a lead finger of a lead frame or a connection pad of a substrate. The second wire crosses and is supported by the first wire. The first wire acts as a brace that prevents the second wire from touching the edge of the die. The first wire also prevents the second wire from excessive lateral movement during encapsulation.

6 Claims, 1 Drawing Sheet

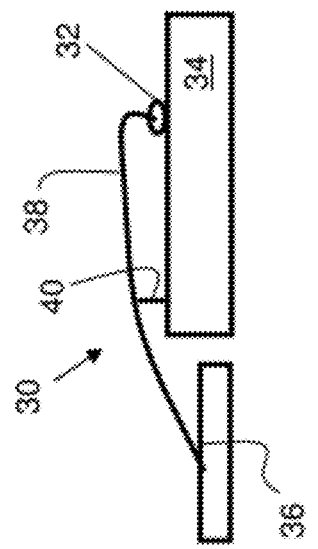
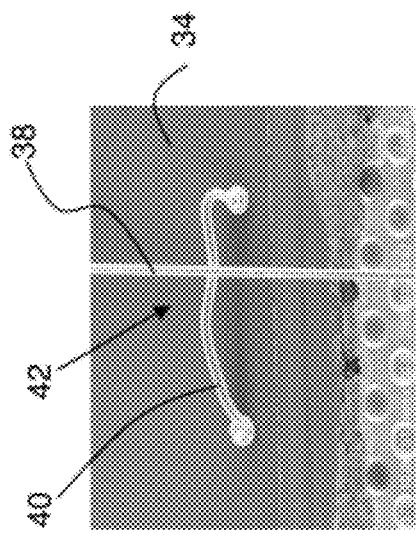
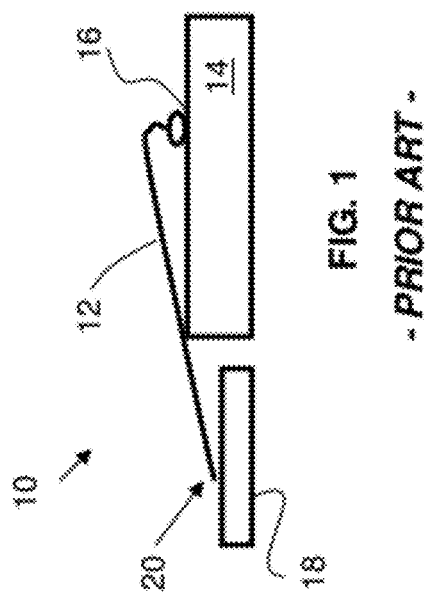

BRACE FOR LONG WIRE BOND

BACKGROUND OF THE INVENTION

The present invention relates to semiconductor packaging in general and more specifically to a brace for a long bond wire to prevent the bond wire from short circuiting.

Wire bonding typically involves connecting a bond pad on an integrated circuit (IC) die to a lead finger of a lead frame with a bond wire. Referring to FIG. 1, a conventional wire bond connection 10 is shown in which a bond wire 12 has one end attached to a bond pad of an integrated circuit die 14 with a ball bond 16 and a second end attached to a lead finger 18 of a lead frame (or to a connection pad of a substrate) with a stitch bond 20.

As die sizes have been shrinking, bond pads on the die, which were traditionally located only along a perimeter of the top surface of the die, now are located both near and far from the die edges, oftentimes in an array format on the top surface of the die. Thus, some of the bond wires, like the wire 12 shown in FIG. 1, are relatively long, extending from a middle or central area of the die 14 to the lead finger 18.

When the bond pad on the die is near to the edge of the die, the loop height of the wire prevents the wire from touching the edge of the die, which would cause a short circuit. However, the long bond wires connecting these further from the edge die pads to the lead frame are susceptible to sagging or drooping, as shown in FIG. 1, in which case they may inadvertently contact the edge of the die 14.

Further, during an encapsulation process, when the die and bond wires are being covered with a mould compound, when the mould compound flows over the surface of the die, such long wires are susceptible to moving laterally, known as wire sweep, causing them to contact other wires. These problems have become more acute as the diameter of the bond wires have decreased.

Thus, it would be advantageous to have bond wires that will not touch the edge of the die or contact other bond wires.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 1 is an enlarged side view of a conventional die to lead frame bond wire connection;

FIG. 2 is an enlarged side view of a die to lead frame bond wire connection in accordance with an embodiment of the present invention;

FIG. 3 is an enlarged top view of the die to lead frame bond wire connection of FIG. 2; and FIG. 4 is an enlarged photograph of a top view of a die to lead frame bond wire connection in accordance with an embodiment of the present invention.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a method of preventing a long bond wire from contacting an edge of a semiconductor die, wherein one end of the long bond wire is attached to a die bond pad that is generally centrally located on a surface of the die and the other end of the long bond wire is attached to a connection pad of a substrate. The method includes, prior to attaching the long bond wire to the die bond pad and the connection pad, attaching a first end of a short bond wire to a first die bond pad that is located proximate to the edge of the die, and attaching a second end of the short bond wire to a second die bond pad near to the first die bond pad, wherein the short bond wire extends from the first die bond pad to the second die bond pad such that the short bond wire is substantially parallel to the edge of the die, and attaching one end of the long bond wire to the generally centrally located die bond pad and the other end to the substrate connection pad, wherein the long bond wire is generally perpendicular to the short bond wire and the short bond wire supports the long bond wire proximate to the edge of the die such that the long bond wire is spaced from the edge of the die.

The present invention also provides an electrical connection from a die bond pad that is generally centrally located on a surface of a semiconductor die to a substrate connection pad spaced from a perimeter of the die. The electrical connection includes a long bond wire having one end attached to the die bond pad and another end attached to the substrate connection pad, and a brace for the long bond wire, the brace located proximate to an edge of the die between the die bond pad and the substrate connection pad, wherein the long bond wire is supported by the brace and the brace prevents the long bond wire from contacting the edge of the die.

Referring now to FIGS. 2, 3 and 4, an electrical connection 30 from a die bond pad 32 that is generally centrally located on a surface of a semiconductor die 34 to a substrate connection pad 36 spaced from a perimeter of the die 34 is shown. The electrical connection 30 includes a long bond wire 38 having one end attached to the die bond pad 32 and another end attached to the substrate connection pad 36. The die 34 is a semiconductor die having an integrated circuit as is well known in the art. The die 34 has bond pads, including the die bond pad 32 located on a first or top major surface. In one embodiment, the die bond pads are disposed in an array on the top surface of the die 34 such that some of the die bond pads are generally centrally located on the top surface such that they are spaced from the die edge. The substrate connection pad 36 may be a connection pad of a multi-layer substrate, a lead finger of a lead frame, or any other electrically conductive pad that is used for facilitating external electrical connection to the integrated circuit.

The electrical connection 30 also includes a brace 40 for supporting the long bond wire 38. The brace 40 is located proximate to the edge of the die 34 between the die bond pad 32 and the substrate connection pad 36. The brace 40 supports the long bond wire 38 and prevents the long bond wire 38 from contacting the edge of the die 34. Preferably, the brace 40 spaces the long bond wire 38 from the die edge by at least two times a diameter of the long bond wire 38.

In one embodiment, the brace 40 comprises a second bond wire that extends generally parallel to the edge of the die 34 and generally perpendicular to the long bond wire 38. In one embodiment, the brace or second bond wire 40 has first and second ends attached to first and second die bond pads. The first and second die bond pads preferably are located proximate to the edge of the die 34 and also, preferably are adjacent to each other. For example, if there is an array of bond pads on the surface of the die 34, then the first and second die pads should be located in the outer row of the array. When the second bond wire is connected to the first and second die bond pads, which can be done using known wire bonding techniques with commercially available wire bonding equipment, the second bond wire extends such that it is generally parallel to the edge of the die 34. In one embodiment of the present invention, the first and second bond pads comprise dummy pads. That is, the first and second bond pads are not arranged to transmit electrical signals to/from an external source to/from the integrated circuit.

When the brace 40 comprises a bond wire, the bond wire 38 may be any commercially available bond wire, such as a gold or copper wire, and may be the same as the long bond wire, i.e., the same materials and diameter. Thus, if the long bond wire 38 is a 1.3 mil Gold wire, then the brace 40 also preferably is a 1.3 mil Gold wire.

Referring now specifically to FIGS. 3 and 4, in one embodiment, the brace 40 includes a recess or kink 42 in the wire 40 within which the long bond wire 38 rests. The recess 42 prevents the long bond wire from excessive lateral movement during encapsulation. The recess 42 may be formed using predetermined settings on commercially available wire bonding equipment.

As is evident from the foregoing discussion, the present invention provides a method of supporting a bond wire so that the bond wire does not touch a die edge.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. An electrical connection from a first die bond pad that is generally centrally located on a surface of a semiconductor die to a substrate connection pad spaced from a perimeter of the die, the electrical connection, comprising:

a long bond wire having one end attached to the first die bond pad and another end attached to the substrate connection pad; and a brace for the long bond wire, the brace located proximate to an edge of the die between the first die bond pad and the substrate connection pad, wherein the long bond wire is supported by the brace and the brace prevents the long bond wire from contacting the edge of the die, wherein the brace comprises a second bond wire having first and second ends attached to second and third die bond pads, wherein the second bond wire includes a kink within which the long bond wire rests and the kink prevents the long bond wire from excessive lateral movement during encapsulation.

2. The electrical connection of claim 1, wherein the second bond wire extends generally perpendicular to the long bond wire.

3. The electrical connection of claim 1, wherein the second and third die bond pads comprise dummy pads.

4. The electrical connection of claim 1, wherein the second bond wire is one of a gold wire and a copper wire.

5. The electrical connection of claim 1, wherein the substrate connection pad comprises a lead finger of a lead frame.

6. The electrical connection of claim 1, wherein the brace spaces the long bond wire from the die edge by at least two times a diameter of the long bond wire.

\* \* \* \* \*